United States Patent
Jacobs et al.

(10) Patent No.: US 10,458,841 B2
(45) Date of Patent: Oct. 29, 2019

(54) METHOD FOR PROCESSING LIGHT SENSOR SIGNALS AND LIGHT SENSOR SYSTEM

(71) Applicant: ams AG, Unterpremstaetten (AT)

(72) Inventors: Dan Jacobs, McKinney, TX (US); Eugene G. Dierschke, Dallas, TX (US)

(73) Assignee: ams AG, Unterpremstetten (AT)

( * ) Notice: Subject to any disclaimer, the term of this patent is extended or adjusted under 35 U.S.C. 154(b) by 222 days.

(21) Appl. No.: 15/535,017

(22) PCT Filed: Nov. 30, 2015

(86) PCT No.: PCT/EP2015/078069
§ 371 (c)(1),
(2) Date: Jun. 9, 2017

(87) PCT Pub. No.: WO2016/091639
PCT Pub. Date: Jun. 16, 2016

(65) Prior Publication Data
US 2018/0266878 A1   Sep. 20, 2018

Related U.S. Application Data

(60) Provisional application No. 62/090,218, filed on Dec. 10, 2014.

(30) Foreign Application Priority Data

Jan. 8, 2015   (EP) .................................... 15150506

(51) Int. Cl.
*G01J 1/04* (2006.01)
*G01J 3/51* (2006.01)
*G01J 1/16* (2006.01)
*G01J 1/32* (2006.01)
*G01J 3/52* (2006.01)
(Continued)

(52) U.S. Cl.
CPC ............ *G01J 1/0488* (2013.01); *G01J 1/0492* (2013.01); *G01J 1/1626* (2013.01); *G01J 1/32* (2013.01);
(Continued)

(58) Field of Classification Search
CPC ...... G01J 1/0488; G01J 1/0492; G01J 1/1626; G01J 1/32; G01J 3/513; G01J 3/524;
(Continued)

(56) References Cited

U.S. PATENT DOCUMENTS 6,768,564 B1 * 7/2004 Gann ................. H04N 1/02895
358/487
8,274,051 B1   9/2012 Aswell et al.
(Continued)

FOREIGN PATENT DOCUMENTS

JP   2011209299 A   10/2011

*Primary Examiner* — Christine S. Kim
(74) *Attorney, Agent, or Firm* — Fish & Richardson P.C.

(57) ABSTRACT

An embodiment of a method for compensating variations in an attenuation of light of an optical filter of a light sensor system comprises illuminating a clear sensor and a color sensor of the light sensor system with a test light having a test spectrum. Therein the color sensor comprises the optical filter and is designed to predominantly sense light with a wavelength within a pass band of the filter; and the test spectrum has components outside the pass band. A clear test signal generated by the clear sensor and a color test signal generated by the color sensor are received in particular in response to the illumination with the test light. Then a first transmission value T is determined based on the clear test signal and on the color test signal. Finally, a compensation factor Kr, Kg, Kb is calculated to compensate the variations in the attenuation of light based on the first transmission value T and a nominal transmission value Tn of the filter.

18 Claims, 2 Drawing Sheets

(51) Int. Cl.
*H01L 31/0216* (2014.01)
*H01L 27/146* (2006.01)

(52) U.S. Cl.
CPC ............ *G01J 3/513* (2013.01); *G01J 3/524* (2013.01); *H01L 27/14621* (2013.01); *H01L 27/14623* (2013.01); *H01L 31/02162* (2013.01)

(58) Field of Classification Search
CPC ......... H01L 27/14621; H01L 27/14623; H01L 31/02162
See application file for complete search history.

(56) References Cited

U.S. PATENT DOCUMENTS

| | | |
|---|---|---|
| 9,163,990 B2 * | 10/2015 | Lianza .................... G01J 3/462 |
| 2006/0023093 A1 | 2/2006 | Tan et al. |
| 2006/0273355 A1 | 12/2006 | Han |
| 2008/0208385 A1 | 8/2008 | Sakamoto et al. |
| 2008/0237453 A1 * | 10/2008 | Chen ........................ G01J 3/51 250/226 |
| 2008/0278592 A1 | 11/2008 | Kuno et al. |
| 2008/0315104 A1 | 12/2008 | Nam |
| 2009/0237382 A1 | 9/2009 | Kunimori |
| 2009/0273679 A1 * | 11/2009 | Gere ...................... H04N 9/045 348/187 |
| 2010/0231770 A1 | 9/2010 | Honda et al. |
| 2010/0282953 A1 | 11/2010 | Tam |
| 2011/0063451 A1 | 3/2011 | Kamon et al. |
| 2011/0285895 A1 | 11/2011 | Weng et al. |
| 2013/0002731 A1 | 1/2013 | Tam |
| 2014/0307098 A1 * | 10/2014 | Kang ................... H04N 13/239 348/164 |
| 2015/0219492 A1 * | 8/2015 | Glover ..................... G01J 5/60 702/196 |

* cited by examiner

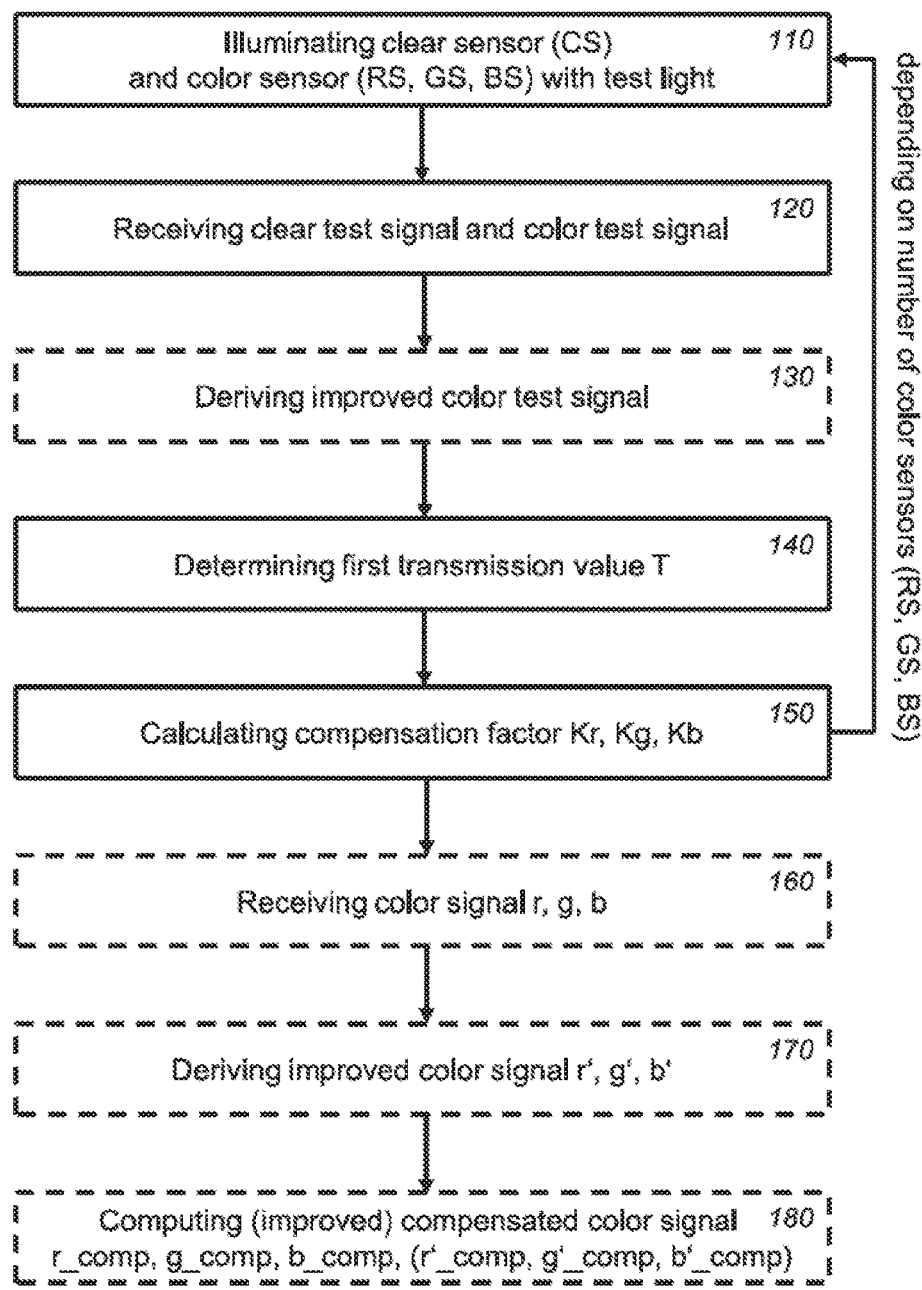

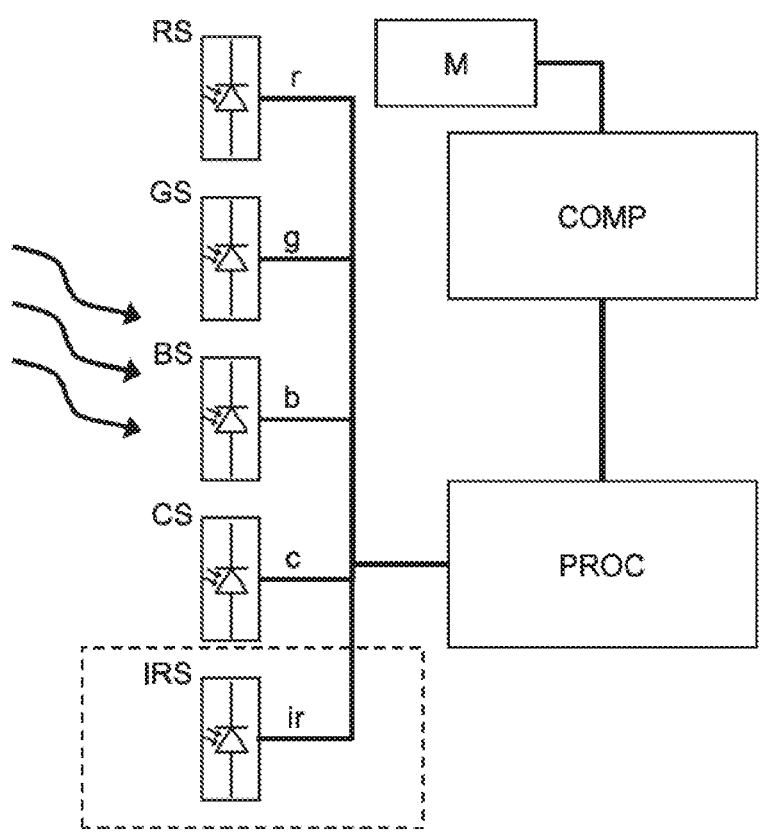

METHOD FOR PROCESSING LIGHT SENSOR SIGNALS AND LIGHT SENSOR SYSTEM

BACKGROUND OF THE INVENTION

Many electronic devices, in particular devices comprising displays or screens, contain light sensors that can be used to determine an actual state of the lighting environment. In this way, it becomes possible to adjust settings of the device automatically for adapting for example the backlighting intensity of the display or screen to various conditions of the lighting environment.

Light sensors utilized currently in electronic devices comprise for example photodiodes that may be equipped with color filters. Such color filters may for example consist of an amorphous composite of pigments or dyes that are encapsulated in a host material of some thickness. The pigment or dye particles feature for example characteristic absorption coefficients which vary with the wavelength of light.

In some applications, the accuracy of measurements performed by means of the light sensor plays an important role.

SUMMARY OF THE INVENTION

The present disclosure provides a higher accuracy in measurements of a lighting environment.

The improved concept is based on the idea to compensate variations in the attenuation of light that may occur due to variations in filter thickness and/or concentration of the pigment or dye. This is achieved by determining a compensation factor to be applied to color signals generated by a light sensor system. In particular the concept is based on illuminating the light sensor system with a test light source and comparing the response of the light sensor system with a nominal response. Thereby the test spectrum of the test light used for illumination of the light sensor system has components outside of a pass band of a respective color sensor. For example, when compensating filter variations effects of a green color sensor, for example blue light, red light or white light may be used as a test light.

According to an embodiment of a method for processing light sensor signals, the method comprises a step of illuminating a clear sensor and one of at least one color sensor of a light sensor system with a test light having a test spectrum. Therein the color sensor comprises an optical filter and is designed to predominantly sense light with a wavelength within a pass band of the filter and the test spectrum has components outside of the pass band. Furthermore, a clear test signal which is generated by the clear sensor and a color test signal which is generated by the color sensor are received, in particular in response to the illumination with the test light. Then a first transmission value T is determined based on the clear test signal and on the color test signal, for example based on a ratio of the clear test signal and the color test signal. Finally, a compensation factor Kr, Kg, Kb is calculated based on the first transmission value T and on a nominal transmission value Tn of the filter, for example based on a difference between the first transmission value T and the nominal transmission value Tn.

By predominantly sensing light with a wavelength within the pass band it is meant that a transmission of light with a wavelength outside of the pass band is suppressed or attenuated. For example light with a wavelength outside of the pass band is suppressed or attenuated on average with respect to light with a wavelength within the pass band. However, light with a wavelength outside the pass band is for example not completely suppressed.

Preferably the light sensor system comprises more than one, for example three color sensors, for example a red color sensor, a green color sensor and a blue color sensor for sensing red, green and blue light, respectively. Alternatively the light sensor system may, for example, contain a cyan sensor, a magenta sensor and a yellow sensor for sensing cyan, magenta and yellow light, respectively. The color sensor, for example, may be implemented as a photodiode, for example a silicon photodiode, with an optical filter. The filter, for example, may consist of an amorphous composite of, for instance, pigment or dye particles that are encapsulated in a host material of some thickness. Deviations of the thickness and/or the concentration of the pigment or dye may result in variations of a spectral transmission of the filter consequently causing variations of a response of the color sensor. For example, a variation in the concentration and a variation in the thickness of the filter may have the same or similar effect on the transmission of the filter. Then an effective filter thickness may be defined that includes the actual filter thickness variations and variations of the pigment or dye concentration.

The filter of the color sensor has a pass band defining the wavelength of light being predominantly sensed by the color sensor. The pass band, or the extent of the pass band, can for example be defined as those wavelengths for which the transmission value of the filter is larger than a certain defined threshold value. The threshold value can, for example, be 50%, 75%, 80% or another threshold value. Alternatively the extent of the pass band may be defined as an interval of wavelengths in a certain defined vicinity of a maximum value of the transmission of the filter. For example the vicinity can be specified by a corresponding area enclosed under the respective transmission curve. For example the area enclosed by the transmission curve within the pass band may be equal to a certain portion of the total area enclosed by the transmission curve within the full visible spectrum. For example, the extent of the pass band may be, depending on the color of the filter, in the order of ten nanometers or in the order of several tens of nanometers or in the order of hundreds of nanometers.

In some implementations, the filter has, apart from the pass band, at least one stop band. The test spectrum has components within the at least one stop band.

For example, if a wavelength of light lies outside the pass band, it lies within the at least one stop band and vice versa.

The transmission value of the filter for light with a wavelength within the stop band lies for example below the defined threshold value. The transmission value of the filter for light with a wavelength within the stop band is not necessarily zero but may be larger than zero. Consequently, in some implementations, there exists one or more wavelengths and/or wavelength ranges lying within the stop band, for which the transmission value is larger than zero.

The test light is, for example, provided by an external light source, for instance a light-emitting diode, LED, in particular a colored LED or a white LED. Alternatively, the test light can be provided for example by a laser. Also other light sources with a broad spectrum or with a narrow spectrum are possible, for example such as incandescent light sources, electroluminescent light sources, gas discharge lamps, combustion based light sources or other light sources. According to the improved concept, the test spectrum of the test light has components outside of the pass band. For example, this may be achieved by using a colored LED as a test light source whereas the respective filter is transmissive for another color. Alternatively a white light source may be used as a test light source, naturally having a spectrum with components outside of a pass band corresponding to a certain color.

According to some implementations of the method, the nominal transmission value Tn depends on the test spectrum.

According to some implementations of the method, the nominal transmission value Tn represents an expected transmission value of the filter for light with a wavelength corresponding to a maximum of the test spectrum or for light with a spectrum corresponding to the test spectrum.

According to some implementations of the method, an expected or nominal transmission value of the filter for light with a wavelength l is given by a nominal transmission function tn(l), wherein tn(l) is varying within the test spectrum, in particular is not constant within the test spectrum, as a function of the wavelength l.

According to an embodiment of the method, the first transmission value T is determined based on an improved color test signal. The improved color test signal is for example derived from the color test signal by removing an infrared component IR.

The infrared component IR can, for example, be determined by multiplying the color test signal with a positive weighting factor and subtracting from the result the clear test signal multiplied with another positive weighting factor. A corresponding method is, for example, disclosed by the patent application EP 2700920 A1 (see also for example equation (8) of the present document), which is herewith incorporated by reference in its entirety.

In alternative embodiments, the infrared component IR is measured by means of an infrared sensor. The infrared sensor comprises a sensor element, for example an infrared sensitive photodiode, and a filter element that passes infrared light. The filter element may for example be implemented as a band pass filter or a high pass filter.

According to an implementation of the method the first transmission value T is determined by means of comparing a signal derived from the color test signal to the clear test signal. In particular the signal derived from the color test signal may be divided by the clear test signal. The signal derived from the color test signal may, for example, be the color test signal itself or the improved color test signal.

Herein the clear test signal is assumed to be equal or approximately equal to a color test signal in a hypothetic setup where no filter is present. The quotient of the signal derived from the color test signal and the clear test signal is therefore regarded as a measure for the first transmission value T.

The comparison may include also other operations in addition or alternatively to the division. For example, instead of the clear test signal, a signal derived from the clear test signal may be used. In particular a weighting of the clear test signal may be performed. For example the comparison may also include a comparison of a function of the color test signal to a function of the clear test signal.

Alternatively, the first transmission value T may be determined by means of comparing the signal derived from the color test signal to a nominal or theoretically expected value for the respective response of the color sensor under the assumption that no filter is present or of the clear sensor. In some implementations of the color sensor, it may also be possible to generate a filterless test signal by illuminating the color sensor with the test light while the filter is actually removed. Then the first transmission value may be determined by comparing the color test signal to the filterless test signal.

According to another implementation of the method the test spectrum is a narrow band spectrum, in particular the test spectrum has a bandwidth which is narrower than the width of the pass band. Furthermore the test spectrum has a maximum outside of the pass band, in particular has a local maximum outside of the pass band. In such an implementation the nominal transmission value Tn represents a transmission value for light with a wavelength corresponding to or lying close to the maximum of the test spectrum expected when the filter has an effective thickness equal to a nominal effective thickness.

The bandwidth of the test spectrum may, for example, be defined via the so-called 3 dB bandwidth. In such a case the bandwidth is defined as the distance between a first wavelength in the respective spectrum and a second wavelength in the respective spectrum determined such that the respective intensity at the first and the second wavelength is equal to half of a maximum intensity of the respective spectrum. Alternatively the first and the second wavelength may be determined as corresponding to an intensity which is another fraction than a half of the maximum intensity value. Alternatively another definition of a bandwidth may be suitable, for example a bandwidth resulting from a fit of an empirical or a theoretically predicted curve to the spectral transmission of the test spectrum.

An example for a test source emitting a test light with a test spectrum that has a narrow bandwidth is, for example, an LED or a laser emitting light of a certain color. Such light sources commonly feature respective bandwidths that are in the order of a fraction of a nanometer, a nanometer or a few nanometers. On the other hand, as mentioned above, the pass band of the filter may commonly lie in the order of tens or hundreds of nanometers for example. For some test spectra, for example if the test light source is a laser or a red, a blue or a green LED, the test spectrum may have only a single maximum. In such a case the maximum of the test spectrum is the single maximum of the test spectrum. For other test light sources, for example a test light source consisting of a plurality of LEDs, for example a blue LED and a yellow LED, the test spectrum may possess a plurality of maxima. In such a case the maximum of the test spectrum may, for example, correspond to the highest of the plurality of maxima. The corresponding wavelength is the so-called peak wavelength of the light source. Alternatively another one of the plurality of maxima may be defined as the maximum of the test spectrum. Other alternatives for the definition of the maximum of the test spectrum are for example the dominant wavelength, the spectral centroid, the median wavelength or another characteristic wavelength of the spectrum.

According to an implementation of the method wherein the test spectrum is a narrow band spectrum, the compensation factor Kr, Kg, Kb is calculated by integrating a second transmission value t(l) and a nominal transmission function tn(l) as a function of a wavelength l according to the formula:

$$Kr, Kg, Kb = [\int dl\; tn(l) \cdot W1(l)] / [\int dl\; t(l) \cdot W1(l)]. \tag{1}$$

Herein, W1(l) is a weighting function and may depend on the wavelength l or may be constant over the wavelength l. The nominal transmission function tn(l) represents an expected transmission value of the filter with a nominal effective thickness and for light with a wavelength l as a function of wavelength l.

To compute the second transmission value t(l), it is formulated according to the proportion $$t(l) \sim e^{(-A \cdot D)}. \tag{2}$$

Hereby D is an effective filter thickness which includes effects of concentration variations and effects of variations of the actual filter thickness. Further, A is a nominal filter absorption coefficient for a nominal concentration of the pigment or dye and depends on the wavelength l.

Analogously, one finds for the nominal transmission function $$tn(l) \sim e^{(-A \cdot Dn)}, \quad (3)$$

wherein Dn is a nominal effective filter thickness which is equivalent to an actual nominal filter thickness. Combining the two equations (2) and (3) results in the following equation for the second transmission value t(l):

$$t(l) = tn(l)^{[\ln(T)/\ln(Tn)]}. \quad (4)$$

The integration of the second transmission value t(l) over the wavelength l in equation (1) represents, when correspondingly weighted by the weighting function W1(l), a measure for the deviation of the total response of the color sensor from a nominal response of the color sensor when illuminated with the test light. The nominal response is the response of the color sensor for a filter with an effective thickness equal to the nominal effective thickness Dn.

According to an implementation of the method the weighting function W1(l) is unity or a function or a functional of at least one of the nominal transmission function tn(l), the photopic function and a spectral power distribution, SPD, of the test light.

According to another implementation of the method the test spectrum is a wide band spectrum, in particular the test spectrum has a bandwidth being wider than a width of the pass band. In such an implementation the nominal transmission value represents an expected transmission value for light with a spectrum corresponding to the test spectrum when the filter has an effective thickness equal to a nominal effective thickness Dn.

In several implementations wherein the test spectrum is a wide band spectrum, the test spectrum is provided by a white light source, for example by a white LED. A white LED or other white light sources commonly may feature a spectrum with a plurality of maxima, for example a maximum corresponding to blue light and a maximum corresponding to yellow, orange or green light. For such a test spectrum, the width of the bandwidth of the test spectrum may for example be specified as the distance between a first wavelength corresponding to a value of the spectral intensity equal to a threshold value and a last wavelength corresponding to a value of the spectral intensity equal to the threshold value. The threshold value may for example be 50%, 75%, 80% or another fraction of a maximum spectral intensity or of another characteristic value of the test spectrum. The first wavelength may for example be a minimal wavelength of all wavelengths corresponding to a value of the spectral intensity equal to the threshold value. The last wavelength may for example be a maximum wavelength of all wavelengths corresponding to a value of the spectral intensity equal to the threshold value.

According to an implementation of the method wherein the test spectrum is a wide band spectrum, the compensation factor Kr, Kg, Kb is calculated according to the formula:

$$Kr, Kg, Kb = W2/T, \quad (5)$$

wherein W2 is a weighting factor depending on the nominal transmission value Tn. For example, the weighting factor W2 may be equal to or proportional to the nominal transmission value Tn.

According to other implementations, the method further comprises steps of receiving a color signal r, g, b from the color sensor and computing a compensated color signal r_comp, g_comp, b_comp based on the compensation factor Kr, Kg, Kb and the color signal r, g, b.

According to further implementations of the method, the compensated color signal r_comp, g_comp, b_comp is computed by means of a multiplication of the compensation factor Kr, Kg, Kb and the color signal r, g, b.

According to some implementations of the method, the method further comprises, in particular during a productive phase of operation of the light sensor system, illuminating the color sensor with ambient light, in particular emitted from an ambient light source.

According to some implementations, the method further comprises steps of receiving a color signal r, g, b from the color sensor as a response to the illumination with the ambient light source and computing a compensated color signal r_comp, g_comp, b_comp based on the compensation factor Kr, Kg, Kb and the color signal r, g, b by means of a multiplication of the compensation factor Kr, Kg, Kb and the color signal r, g, b.

According to some implementation of the method, the method further comprises determining an illuminance and/or a correlated color temperature of the ambient light based on the compensated color signal r_comp, g_comp, b_comp.

As explained above, a compensation factor Kr, Kg, Kb may for example correspond to or be proportional to an inverse of a measure for the deviation of the response of the color sensor from a nominal response of the color sensor. Therefore multiplying the compensation factor Kr, Kg, Kb and the color signal r, g, b may compensate variations in the color signal r, g, b due to concentration variations of the pigment or dye and/or thickness variations of the filter.

In several embodiments of the method an improved compensated color signal r'_comp, g'_comp, b'_comp is computed by means of multiplying the compensation factor Kr, Kg, Kb and an improved color signal r', g', b'. The improved color signal r', g', b' is derived from the color signal by removing an infrared component in an analog way as explained above for the color test signal and the improved color test signal, respectively.

According to the improved concept, a light sensor system comprises at least one color sensor with an optical filter, the color sensor being configured to sense light of a certain color, in particular light with a wavelength within a pass band of the filter. The color sensor is configured to generate at least one color signal r, g, b. The light sensor system further comprises a clear sensor configured to sense light within the full visible spectrum and to generate a clear signal c. The light sensor system further comprises a memory for storing at least one compensation factor Kr, Kg, Kb. The compensation factor Kr, Kg, Kb stored in the memory is thereby calculated by any of the described implementations and embodiments of the method according to the improved concept. Furthermore, the light sensor system is coupled to a compensation unit which is configured to generate at least one compensated color signal r_comp, g_comp, b_comp according to at least one respective formula of the formulae:

$$r\_comp = Kr \cdot r, \quad (6a)$$

$$g\_comp = Kg \cdot g, \text{ and} \quad (6b)$$

$$b\_comp = Kb \cdot b. \quad (6c)$$

The light sensor system may for example include a microchip that comprises the color sensor and the clear sensor. The compensation unit may also be implemented or partly implemented within the microchip or may lie external. The memory may as well be contained by the microchip. Alternatively the memory may be part of another piece of hardware coupled to the microchip.

According to some implementations the light sensor system further comprises a processing circuit which is configured to determine an infrared component IR of light incident on the light sensor system based on at least one color signal r, g, b and the clear signal c. The processing circuit is further configured to determine a type of a light source which illuminates the light sensor system. The type of the light source is thereby determined based on the infrared component IR and at least one of the clear signal c and the at least one color signal r, g, b.

Furthermore in such implementations at least two sets of compensation factors are stored in the memory. Each of the sets may contain one or more compensation factors depending on the number of color sensors comprised by the light sensor system. The compensation factors are thereby calculated using a method according to the improved concept wherein the test spectrum is a wide band spectrum as described above. In such implementations the at least one compensation factor Kr, Kg, Kb is chosen from the at least two sets depending on the determined type of the light source in order to generate the at least one compensated color signal r_comp, g_comp, b_comp.

According to other implementations the light sensor system further comprises a processing circuit which is configured to determine an infrared component IR of light incident on the light sensor system based on at least one color signal r, g, b and the clear signal c. The processing circuit is further configured to generate at least one improved color signal r', g', b' by subtracting the infrared component IR from each of the at least one color signal r, g, b, respectively. In such implementations the compensation unit is configured to generate at least one improved compensated color signal r'_comp, g'_comp, b'_comp according to at least one respective formula of the formulae:

$$r'\_comp = Kr \cdot r', \quad (7a)$$

$$g'\_comp = Kg \cdot g', \text{ and} \quad (7b)$$

$$b'\_comp = Kb \cdot b'. \quad (7c)$$

According to some implementations, the light sensor system further comprises an infrared sensor configured to sense infrared light and to generate an infrared signal ir based on the sensed infrared light. The processing circuit is then configured to determine the infrared component IR of light incident on the light sensor system based on the infrared signal ir additionally or alternatively to the determination of the an infrared component IR based on the at least one color signal r, g, b and the clear signal c.

The infrared sensor may for example be implemented within the microchip that comprises the color sensor and the clear sensor or may lie external. In alternative implementations, the infrared sensor may not be comprised by but coupled to the light sensor According to other implementations of the light sensor system comprising a processing circuit, the processing circuit is further configured to determine a type of a light source which illuminates the light sensor system as well as to generate at least one improved color signal r', g', b' as described for the implementations above. In such implementations also at least two sets of compensation factors calculated using a method according to the improved concept, wherein the test spectrum is a wide band spectrum, are stored in the memory. Furthermore in such implementations the at least one compensation factor Kr, Kg, Kb is chosen from the at least two sets depending on the determined type of light source for the generation of the at least one improved compensated color signal r'_comp, g'_comp, b'_comp. The compensation unit is configured to generate the at least one improved compensated color signal r'_comp, g'_comp, b'_comp as described above.

In the described implementations, the type of the light source may for example be determined based on a ratio of the determined infrared component IR and at least one of the clear signal c and the at least one color signal r, g, b. Alternatively a ratio of the determined infrared component IR and at least one of an improved clear signal c' and the at least one improved color signal r', g', b' may be utilized. Herein the improved clear signal c' is generated by the processing circuit by subtracting the infrared component IR from the clear signal c.

The processing circuit may also be contained in a microchip, for example in a microchip that also contains the color sensor and the clear sensor and/or the compensation unit. Alternatively the processing unit may also be implemented separately.

According to further implementations of the light sensor system the clear sensor is further configured to generate a clear test signal during a test phase during which the light sensor system is illuminated with a test light having a test spectrum having components outside the pass band of the filter. In such implementations the color sensor is further configured to generate a color test signal during the test phase and the compensation unit is further configured to determine a first transmission value T based on the clear test signal and on the color test signal. The compensation unit is further configured to calculate the compensation factor Kr, Kg, Kb based on the first transmission value T and the nominal transmission value Tn of the filter. The compensation unit is configured to store the compensation factor Kr, Kg, Kb in the memory.

According to several implementations of the light sensor system the compensation unit is further configured to generate an improved color test signal by removing an infrared component IR from the color test signal and to determine the first transmission value based on the improved color test signal.

Herein the infrared component IR may, for example, be determined as described with respect to the methods according to the improved concept. Furthermore, for example, the first transmission value T may be determined by dividing the color test signal or the improved color test signal by the clear test signal, as described above for the method.

In some implementations of the light sensor system, the compensation unit is comprised by the light sensor system.

In some implementations of the light sensor system, the compensation unit is not comprised by the light sensor system.

In some implementations of the light sensor system, for example in such implementations where the compensation unit is not comprised by the light sensor system, the at least one compensation factor Kr, Kg, Kb is stored permanently in the memory, in particular is stored unchangeably in the memory.

In some implementations, the light sensor system comprises a microchip. The color sensor, the clear sensor and the memory are comprised by the microchip. The at least one compensation factor Kr, Kg, Kb is stored permanently in the memory, in particular is stored unchangeably in the memory.

Such implementations may have the advantage that the compensation factor Kr, Kg, Kb is permanently and safely associated with the light sensor system or microchip.

Furthermore, additional implementations and embodiments of the method may be readily derived from the various implementations and embodiments of the light sensor system and vice versa. If suitable, the different implementations and embodiments of the method and the light sensor system may also be split and/or otherwise combined to be adapted for specific applications.

BRIEF DESCRIPTION OF THE DRAWINGS

In the following the improved concept is explained in detail with the aid of exemplary embodiments and implementations by reference to the drawings. Components that are functionally identical or have an identical effect are denoted by identical references. Identical or effectively identical components might be described only with respect to the figure where they occur first, their description is not necessarily repeated in successive figures.

IN THE DRAWINGS

FIG. 1 shows an exemplary embodiment of the method according to the improved concept; and FIG. 2 shows an exemplary embodiment of a light sensor system according to the improved concept.

DETAILED DESCRIPTION

FIG. 1 shows an embodiment of a method according to the improved concept for processing light sensor signals. The method begins in block 110 in which a clear sensor CS and one of at least one color sensor RS, GS, BS are illuminated with test light. Therein the test light is emitted by a test light source and has a test spectrum. Furthermore, the color sensor RS, GS, BS comprises an optical filter and is designed to sense, in particular to predominantly sense, light or components of light with a wavelength within a pass band of the filter. The test spectrum has components outside of the pass band. In particular the test spectrum may lie completely outside of the pass band, meaning that an intensity of components within the pass band is negligibly small compared to the overall intensity or the overall intensity within the visible spectrum. For other implementations the test spectrum has significant components outside the pass band but may have also significant components within the pass band.

For example, the test light source may be a narrow spectrum light source as for example an LED or a laser. In such an implementation the test spectrum may commonly lie completely out of the pass band of the filter. In other implementations different narrow spectrum light sources may be used. Alternatively for other embodiments of the method a white light source, for example a white LED or an incandescent light source or a light source emitting light with a spectrum similar to sunlight or a light source emitting light with a uniform power distribution may be utilized. The type or characteristics of the light source may, for example, be described by means of a spectral power distribution, SPD, curve. The SPD describes the wavelength-dependent power per unit area of an illumination, i.e. of a light source.

In block 120 a clear test signal and a color test signal are received. Hereby the clear test signal is generated by the clear sensor CS and the color test signal is generated by the color sensor RS, GS, BS.

In the optional block 130 an improved color test signal may be derived from the color test signal by removing an infrared component IR from the color test signal. The infrared component IR may, for example, be determined by multiplying the color test signal with a positive weighting factor and subtracting from the result the clear test signal multiplied with another positive weighting factor. In implementations of the light sensor system comprising more than one color sensor RS, GS, BS, the infrared component IR may, for example, be determined by summing up the appropriately weighted color test signals from each of the color sensors RS, GS, BS and subtracting from the result the correspondingly weighted clear test signal. Alternatively, the infrared component IR may be measured directly as an infrared signal it for example by means of an infrared sensor IRS.

In block 140 a first transmission value T is determined. In particular the first transmission value T is determined based on the clear test signal and on the color test signal. In particular if an improved color test signal has been derived in block 130, the first transmission value T may be determined based on the improved color test signal and the clear test signal. The first transmission value T is for example determined by means of dividing either the color test signal or, if derived, the improved color test signal by the clear test signal. As described above, this is based on the assumption that the clear test signal represents a signal generated by the color sensor RS, GS, BS if no filter would be present. In this way the first transmission value T may be identified with a transmission value of the filter.

In block 150 a compensation factor Kr, Kg, Kb is calculated based on the first transmission value T and on a nominal transmission value Tn of the filter. Depending on the test spectrum, the nominal transmission value Tn may for example represent an expected transmission value of the filter for light with a wavelength corresponding to a maximum of the test spectrum. This may be particularly suitable if the test spectrum is a narrow band spectrum which has a bandwidth being narrower than a width of the pass band. In particular, for such a narrow band spectra a distinct maximum outside of the pass band may be present. The compensation factor Kr, Kg, Kb is then computed according to equations (1) and (4).

Alternatively, for a test spectrum being a wide band spectrum, in particular having a bandwidth being wider than a width of the pass band, the nominal transmission value Tn may, for example, represent an expected transmission value for light with a spectrum corresponding to the test spectrum. In such an implementation the nominal transmission value Tn cannot be associated with a certain individual wavelength, but rather with a characteristic of the whole test spectrum, for example its SPD curve. Then, the compensation factor Kr, Kg, Kb is computed according to equation (5).

In implementations wherein the light sensor system comprises more than one color sensor RS, GS, BS, the blocks 110 to 150 may be repeated for each of the at least one color sensors RS, GS, BS. In particular for each of the color sensors RS, GS, BS a different test light and/or a different test light source may be used, for example depending on the pass band of the respective filter. In addition, the blocks 110 to 150 may be repeated for different test sources emitting light with different SPD in order to obtain a compensation factor Kr, Kg, Kb not only for each of the color sensors RS, GS, BS but also for light with different SPD.

In optional block 160 at least one color signal r, g, b is received. The color signal r, g, b is generated by at least one color sensor RS, GS, BS of the light sensor system. In optional block 170 an improved color signal r', g', b' is derived. In particular it is derived by removing an infrared component IR from the color signal r, g, b. The infrared component IR can, for example, be determined mutatis mutandtis as described above for the derivation of the improved color test signal.

Alternatively or in addition to the removal of the infrared component IR, the improved color signal r', g', b' may also be derived in a different way from the color signal r, g, b or different methods may be used to improve the accuracy of the color signal r, g, b before proceeding with the method according to the improved concept. The same holds mutatis mutandis for the optional derivation of the improved color test signal from the color test signal in block 130.

In optional block 180 at least one compensated color signal r_comp, g_comp, b_comp is computed according to equations (6a)-(6c). Alternatively, if in optional block 170 an improved color signal r', g', b' is derived, an improved compensated color signal r'_comp, g'_comp, b'_comp may be computed in block 180 according to equations (7a)-(7c).

FIG. 2 shows an exemplary embodiment of a light sensor system according to the improved concept. A red color sensor RS, a green color sensor GS, a blue color sensor BS and a clear sensor CS are connected to a processing circuit PROC. Optionally, the light sensor system comprises an infrared sensor IRS connected to the processing circuit PROC. The optional infrared sensor IRS may alternatively not be comprised by the light sensor system but be an external component. In the shown example, the color sensors RS, GS, BS and, if applicable, the optional infrared sensor IRS are implemented as photodiodes, which may in particular be silicon photodiodes, with respective optical filters attached. In particular, the filters may for example be implemented as amorphous absorption filters, which in particular consist of an amorphous composite of pigment or dye particles encapsulated in a host material of some thickness. The red, the green and the blue color sensors RS, GS, BS comprise different optical filters, in particular comprise optical filters with different pass bands.

In the shown example also the clear sensor CS is implemented as a photodiode, which may in particular be a silicon photodiode. The clear sensor CS does not necessarily comprise an optical filter. However, also the clear sensor CS can comprise a band pass filter passing for example light within the visible spectrum or within a part of the visible spectrum or a long pass filter passing for example light within the visible spectrum or part of the visible spectrum and infrared components and/or longer wavelength components of light. The clear sensor CS may also, for example, comprise a short pass filter passing for example light of the visible spectrum or of parts of the visible spectrum and shorter wavelength components of light, as for example ultraviolet light. The clear sensor CS may for example also contain combinations of such filters. The clear sensor CS may, for example, also comprise different filters, for example grey filters or other optical filters. Alternatively or in addition, the whole light sensor system may comprise filters such as the filters discussed for the clear sensor CS.

In addition to the named color filters comprised by the red, the green and the blue color sensors RS, BS, GS the color sensors RS, GS, BS may, for example, also comprise different filters, such as the filters described with respect to the clear sensor CS.

The processing circuit PROC is further coupled to a compensation unit COMP which is turn coupled to a memory M. The detailed arrangement of the memory M, the compensation unit COMP and the processing circuit PROC may also deviate from the shown example. In particular the memory M may, for example, be coupled alternatively or additionally to the processing circuit PROC. The memory M and the compensation unit COMP may also be coupled to one or more of the color sensors RS, GS, BS and the clear sensor CS.

In the memory M one or more compensation factors Kr, Kg, Kb or a plurality of sets of compensation factors Kr, Kg, Kb is stored. The compensation factors Kr, Kg, Kb or the sets of compensation factors Kr, Kg, Kb are calculated according to one of the various implementations or embodiments of the method according to the improved concept. They may either be determined using another light sensor system or by using the light sensor system shown in FIG. 2 as described in the following. In cases where a plurality of sets of compensation factors Kr, Kg, Kb is stored in the memory M, each set may comprise a compensation factor Kr, Kg, Kb for each of the at least one color sensor RS, GS, BS. Furthermore, each set may correspond to a respective test spectrum.

The clear sensor CS generates a clear test signal during a test phase during which the light sensor system is illuminated with a test light having a test spectrum. The red, green and blue color sensors RS GS, BS generate respective color test signals during the test phase and the compensation unit COMP determines first transmission values T based on the clear test signal and on the color test signals. The compensation unit COMP is further configured to calculate respective compensation factors Kr, Kg, Kb based on the first transmission values T and on nominal transmission values Tn of the filters of the respective color sensors RS, GS, BS. Then the compensation unit COMP stores the compensation factors Kr, Kg, Kb in the memory M.

Alternatively the compensation unit COMP generates improved color test signals by removing an infrared component IR from the color test signals and determines the first transmission values T based on the improved color test signals.

In particular the first transmission value T may be determined by dividing the color test signals or the improved colors test signal by the clear test signal, as described earlier.

The compensation unit then computes the compensation factors Kr, Kg, Kb for example according to equations (1) and (4) or according to equation (5), depending on the test spectrum of the test light source, as described earlier. The test phase and the calculation of the compensation factors Kr, Kg, Kb may also be repeated several times utilizing different test light sources with different test spectra, in particular featuring different SPDs. The test phase and the calculation of the compensation factors Kr, Kg, Kb may also be repeated several times to determine the respective compensation factors Kr, Kg, Kb for the red, green and blue color sensors RS, GS, BS, respectively.

During a productive phase of operation upon incident light (indicated by undulated arrows in FIG. 2) the color sensors RS, GS, BS and the clear sensor CS generate respective color signals r, g, b and a clear signal c, respectively.

The processing circuit PROC may then determine an infrared component IR based on the color signals r, g, b and the clear signal c, for example according to the formula from the patent application EP 2700920 A1:

$$IR = a\_r \cdot r + a\_g \cdot g + a\_b \cdot b - a\_c \cdot c, \quad (8)$$

wherein a_r, a_g, a_b and a_c are positive weighting factors. Then the processing circuit PROC may calculate improved color signals r', g', b' and an improved clear signal c' by subtracting the infrared component IR from the respective of the color signals r, g, b and the clear signal c. Alternatively or in addition, the infrared component IR may be determined by the equation $$IR = a\_ir \cdot ir,$$

wherein the infrared signal it is generated by the optional infrared sensor IRS.

Furthermore, the processing circuit PROC may determine a type of the light source illuminating the light sensor system during the productive phase based on the infrared component IR.

The compensation unit COMP then computes compensated color signals r_comp, g_comp, b_comp according to the formulae (6a)-(6c) and/or computes improved compensated color signals r'_comp, g'_comp, b'_comp according to the formulae (7a)-(7c). To this end, the compensation unit COMP may or may not select the compensation factors Kr, Kg, Kb from sets of compensation factors according to the determined type of the light source.

In such implementations it is made use of a relation between the type of the light source and the content or relative content of infrared components within the spectrum of the light emitted by the light source. For example the relative content of infrared components in light emitted by incandescent light source may differ from a respective relative content in light emitted by an LED. In the described implementations, the type of the light source may for example be determined based on a ratio of the determined infrared component IR and at least one of the clear signal c and the at least one color signal r, g, b or on a ratio of the determined infrared component IR and at least one of the improved clear signal c' and the at least one improved color signal r', g', b'.

In particular the compensation factor Kr, Kg, Kb may be chosen such that the test light source utilized for its generation matches or approximately matches or otherwise corresponds to the determined type of the light source. Such choice may for example lead to a further improved accuracy of a measurement. This is due to the fact that, as described above with respect to the method, the nominal transmission value Tn represents an expected transmission value for light with a spectrum corresponding to the test spectrum and therefore the calculated compensation factor Kr, Kg, Kb yields best results when applied to a color signal r, g, b resulting from illumination by a similar light source.

The various embodiments and implementations of the method and the light sensor system according to the improved concept provide a means to improve the accuracy of measurements regarding lighting environments for example of electronic devices.

Alternatively to the lastly described embodiments utilizing a red, a green and a blue color sensor RS, GS, BS, the improved concept may analogously be applied to systems containing color sensors sensitive to other colors. For example a cyan, a magenta and a yellow color sensor could be used. Also combinations of other colors may be suitable. The improved concept may in the same way be applied to systems containing only one or two color sensors or to such containing four or more color sensors.

In implementations, where the compensation unit COMP is not comprised by the light sensor system, the compensation unit COMP may for example be part of an external computer. In such implementations the color compensation factors Kr, Kg, Kb may, for example, be stored in the memory M and may be made available to a user for calculation of the compensated color signal r_comp, g_comp, b_comp and/or the improved compensated color signal r'_comp, g'_comp, b'_comp using an appropriate software on the computer.

In some implementations of the light sensor system the compensation factor Kr, Kg, Kb is determined using the same light sensor system as for generating the color signals r, g, b and for calculating the compensated color signals r_comp, g_comp, b_comp. In other implementations the compensation factor Kr, Kg, Kb may be determined with one light sensor system while the color signals r, g, b are determined and the compensated color signals r_comp, g_comp, b_comp are calculated by another light sensor system.

The invention claimed is:

1. A method for compensating variations in an attenuation of light of an optical filter of a light sensor system, wherein the method comprises:
    illuminating a clear sensor and a color sensor of the light sensor system with a test light having a test spectrum, wherein
        the color sensor comprises the optical filter and is designed to predominantly sense light with a wavelength within a pass band of the optical filter, and
        the test spectrum has components outside the pass band;
    receiving, in response to the illumination with the test light, a clear test signal generated by the clear sensor and a color test signal generated by the color sensor;
    determining a first transmission value T based on the clear test signal and on the color test signal; and
    calculating a compensation factor Kr, Kg, Kb to compensate the variations in the attenuation of light based on the first transmission value T and a nominal transmission value Tn of the optical filter,
    wherein the first transmission value T is determined by dividing a signal derived from the color test signal by the clear test signal.

2. The method of claim 1, wherein the nominal transmission value Tn depends on the test spectrum.

3. The method of claim 1, wherein the optical filter has at least one stop band and the test spectrum has components within the at least one stop band.

4. The method of claim 1, wherein the nominal transmission value Tn represents an expected transmission value of the optical filter for light with a wavelength corresponding to a maximum of the test spectrum or for light with a spectrum corresponding to the test spectrum.

5. The method of claim 1, wherein the signal derived from the color test signal is derived from the color test signal by removing an infrared component.

6. The method of claim 1, wherein
    the test spectrum is a narrow band spectrum having a bandwidth being narrower than a width of the pass band;
    the test spectrum has a maximum outside of the pass band;
    the nominal transmission value Tn represents a nominal transmission value for light with a wavelength corresponding to the maximum of the test spectrum.

7. The method of claim 6, wherein the compensation factor Kr, Kg, Kb is calculated by integrating a second transmission value t(l) as a function of a wavelength l according to the formula:

$$Kr, Kg, Kb = [\int dl \, tn(l) \cdot W1(l)] / [\int dl \, t(l) \cdot W1(l)], \text{ wherein}$$

W1(l) is a weighting function that either depends on the wavelength l or is constant over the wavelength l, a nominal transmission function tn(l) represents a nominal transmission value for light with a wavelength l as a function of wavelength l, and the second transmission value t(l) is computed according to the formula:

$$t(l)=tn(l)^{[\ln(T)/\ln(Tn)]}.$$

8. The method of claim 7, wherein the weighting function W1(l) is a function or a functional of at least one of the nominal transmission function tn(l), the photopic function and a spectral power distribution of the test light.

9. The method of claim 1, wherein
the test spectrum is a wide band spectrum, has a bandwidth being wider than a width of the pass band; and
the nominal transmission value Tn represents a nominal transmission value for light with a spectrum corresponding to the test spectrum.

10. The method of claim 9, wherein the compensation factor Kr, Kg, Kb is calculated according to the formula: Kr,Kg,Kb−W2/T, and
wherein W2 is a weighting factor.

11. The method of claim 1, further comprising the steps of:
receiving a color signal r, g, b from the color sensor; and
computing a compensated color signal r_comp, g_comp, b_comp by means of a multiplication of the compensation factor Kr, Kg, Kb and the color signal r, g, b.

12. The method of claim 1, further comprising, during a productive phase of operation of the light sensor system:
illuminating the color sensor with ambient light;
receiving a color signal r, g, b from the color sensor as a response to the illumination with the ambient light source; and
computing a compensated color signal r_comp, g_comp, b_comp by means of a multiplication of the compensation factor Kr, Kg, Kb and the color signal r, g, b.

13. A light sensor system comprising:
at least one color sensor with an optical filter, the color sensor being configured to predominantly sense light with a wavelength within a pass band of the filter, and to generate at least one color test signal r, g, b;
a clear sensor configured to sense light within the full visible spectrum and to generate a clear test signal c; and
a processing circuit configured to:
cause a light source to illuminate the clear sensor and the at least one color sensor with a test light having a test spectrum, wherein the test spectrum has components outside the pass band of the optical filter;
receive, in response to the illumination with the test light, the clear test signal c generated by the clear sensor and the at least one color test signal r, g, b generated by the at least one color sensor;
determine a first transmission value T based on the clear test signal c and on the at least one color test signal r, g, b; and
compensate variations in an attenuation of light of the optical filter, wherein compensating variations in the attenuation of light of the optical filter comprises:
calculating at least one compensation factor Kr, Kg, Kb based on the first transmission value T and a nominal transmission value Tn of the optical filter, wherein the first transmission value T is determined by dividing a signal derived from the at least one color test signal r, g, b by the clear test signal, and generating, using a compensation unit, at least one compensated color signal r_comp, g_comp, b_comp according to at least one respective formula of the formulae:

$$r\_comp=Kr\cdot r;$$

$$g\_comp=Kg\cdot g, \text{ and}$$

$$b\_comp=Kb\cdot b.$$

14. The light sensor system according to claim 13, wherein the processing circuit is configured to:
determine an infrared component IR of light incident on the light sensor system; and
based on the infrared component IR and at least one of the clear signal c and the at least one color signal r, g, b, determine a type of a light source illuminating the light sensor system; and wherein
at least two sets of compensation factors Kr, Kg, Kb are calculated, and
for the generation of the at least one compensated color signal r_comp, g_comp, b_comp the at least one compensation factor Kr, Kg, Kb is chosen from the at least two sets of compensation factors Kr, Kg, Kb depending on the determined type of the light source.

15. The light sensor system according to claim 14, wherein the processing circuit is configured to:
determine the infrared component IR based on at least one of:
the at least one color signal r, g, b and the clear signal c, or
an infrared signal it generated by an infrared sensor comprised by the light sensor system.

16. The light sensor system according to claim 13, wherein the processing circuit is configured to:
determine an infrared component IR of light incident on the light sensor system; and
to generate at least one improved color signal r', g', b' by subtracting the infrared component IR from each of the at least one color signal r, g, b, respectively; and
wherein the compensation unit is configured to generate at least one improved compensated color signal r'_comp, g'_comp, b'_comp according to at least one respective formula of the formulae:

$$r'\_comp=Kr\cdot r',$$

$$g'\_comp=Kg\cdot g', \text{ and}$$

$$b'\_comp=Kb\cdot b'.$$

17. The light sensor system according to claim 13, wherein the processing unit is further configured to:
generate, using the compensation unit, an improved color test signal by removing an infrared component IR from the color test signal r, g, b; and
determine, using the compensation unit, the first transmission value T based the improved color test signal.

18. The light sensor system according to claim 13, the light sensor system comprising a microchip and a memory, wherein the color sensor, the clear sensor and the memory are comprised by the microchip and the at least one compensation factor Kr, Kg, Kb is stored permanently in the memory.

* * * * *